United States Patent
Rao et al.

(10) Patent No.: US 11,329,082 B2
(45) Date of Patent: May 10, 2022

(54) IMAGE SENSOR AND ELECTRONIC DEVICE

(71) Applicant: OMNIVISION TECHNOLOGIES (SHANGHAI) CO., LTD., Shanghai (CN)

(72) Inventors: Jinhua Rao, Shanghai (CN); Haibo Xiao, Shanghai (CN)

(73) Assignee: OMNIVISION TECHNOLOGIES (SHANGHAI) CO., LTD., Shanghai (CN)

( * ) Notice: Subject to any disclaimer, the term of this patent is extended or adjusted under 35 U.S.C. 154(b) by 178 days.

(21) Appl. No.: 16/983,422

(22) Filed: Aug. 3, 2020

(65) Prior Publication Data
US 2021/0167104 A1 Jun. 3, 2021

(30) Foreign Application Priority Data
Dec. 3, 2019 (CN) .......................... 201911222363.9

(51) Int. Cl.
*H01L 27/146* (2006.01)

(52) U.S. Cl.
CPC .. *H01L 27/14614* (2013.01); *H01L 27/14643* (2013.01); *H01L 27/14689* (2013.01)

(58) Field of Classification Search
CPC ......... H01L 27/14603; H01L 27/14614; H01L 27/14643; H01L 27/14689
(Continued)

(56) References Cited

U.S. PATENT DOCUMENTS

| 7,741,143 B2 * | 6/2010 | Paik .................. H01L 27/14689 |
| | | 257/E31.103 |
| 9,831,279 B2 | 11/2017 | Jin et al. |

(Continued)

FOREIGN PATENT DOCUMENTS

| CN | 110112161 A | * | 8/2019 | ....... H01L 27/14638 |
| JP | 2016018958 A | * | 2/2016 | ....... H01L 27/14614 |

(Continued)

OTHER PUBLICATIONS

Office Action received for Taiwanese Patent Application No. 109131214, dated Mar. 5, 2021, 8 pages (1 pages of English Translation of Search Report and 7 pages of Office Action).

Primary Examiner — Matthew E Warren
(74) Attorney, Agent, or Firm — Womble Bond Dickinson (US) LLP

(57) ABSTRACT

An image sensor and an electronic device are disclosed. At least one pixel in the image sensor includes a photodiode, a floating diffusion region and a transfer transistor located between the photodiode and the floating diffusion region. The photodiode includes a carrier-accumulation region, and a gate of the transfer transistor extends up to the carrier-accumulation region. The gate extends away from the floating diffusion region and overlaps over half of a width of the carrier-accumulation region. Since carriers move at a higher speed in a fast transfer channel in the semiconductor substrate around such a gate, increasing the length of the transfer transistor's gate extending away from the floating diffusion region and overlapping range with the carrier-accumulation region can facilitate fast movement of carriers from the carrier-accumulation region through such fast transfer channels to the floating diffusion region, thereby improving overall carrier transfer efficiency and optimizing performance thereof.

18 Claims, 2 Drawing Sheets

(58) Field of Classification Search
USPC .................................. 257/291, 292, 457, 459
See application file for complete search history.

(56) References Cited

U.S. PATENT DOCUMENTS

| | | | |
|---|---|---|---|
| 2009/0200589 A1* | 8/2009 | Qian | ................... H01L 27/1464 |
| | | | 257/292 |
| 2014/0349437 A1* | 11/2014 | Hisanori | ........... H01L 27/14612 |
| | | | 438/59 |
| 2016/0219236 A1* | 7/2016 | Maeda | .............. H01L 27/14612 |
| 2017/0069672 A1 | 3/2017 | Jin et al. | |
| 2020/0266223 A1* | 8/2020 | Takahashi | ......... H01L 27/14603 |
| 2021/0020674 A1* | 1/2021 | Woo | ..................... H04N 5/3745 |

FOREIGN PATENT DOCUMENTS

| | | | | |
|---|---|---|---|---|
| KR | 20160078613 A | * | 7/2016 | ....... H01L 27/14614 |
| TW | 201415542 A | | 4/2014 | |
| TW | 201517258 A | | 5/2015 | |
| TW | 201946257 A | | 12/2019 | |

\* cited by examiner

IMAGE SENSOR AND ELECTRONIC DEVICE

CROSS-REFERENCE TO RELATED APPLICATION

This application claims the priority of Chinese patent application number 201911222363.9, filed on Dec. 3, 2019, the entire contents of which are incorporated herein by reference.

TECHNICAL FIELD

The present invention relates to the field of semiconductor technology and, in particular, to an image sensor and an electronic device.

BACKGROUND

Image sensors have been widely used in our daily lives and in security, transportation, medical care and many other industries, for example, in electronic devices such as digital cameras, mobile phones, security cameras, etc. Accordingly, research on the manufacturing and performance of image sensors, especially complementary metal oxide semiconductor (CMOS) image sensors, is growing rapidly.

An image sensor usually includes a pixel array consisting of a large number of pixels, each having a light-sensing element, typically a photodiode (PD), which receives incident light and produces carriers in an amount proportional to the incident energy. Conventionally, such photodiode-produced carriers are transferred to a floating diffusion region (FD) located at another position lateral to the semiconductor substrate. Between the PD and FD, there is arranged a transfer transistor controlled by a transfer gate.

However, in some applications, in order to facilitate light absorption of pixels in an image sensor, each pixel would be provided with a photodiode with a large lateral size (or lateral width). Among carriers (i.e., signal charges) produced by such a photodiode, some are relatively distant from a vertical transfer transistor and subject to an insignificant electrical potential difference. As a result, they first slowly diffuse laterally to the vicinity of the transfer transistor and are then quickly transferred to a floating diffusion region on the other side of the vertical transfer transistor. This leads to a low overall transfer efficiency that is unfavorable to image sensor optimization.

SUMMARY OF THE INVENTION

In the present invention, there is provided an image sensor with performance optimized by improved carrier transfer efficiency of pixels therein. Also provided is an electronic device comprising such an image sensor.

In one aspect of the present invention, there is provided an image sensor comprising a plurality of pixels, wherein each of at least one of the plurality of pixels comprises:

a photodiode formed in a semiconductor substrate, the photodiode having a carrier-accumulation region;

a floating diffusion region arranged in the semiconductor substrate side by side with respect to the photodiode, the floating diffusion region extending upward to a surface of the semiconductor substrate; and a transfer transistor located between the photodiode and the floating diffusion region, the transfer transistor configured to transfer carriers in the carrier-accumulation region to the floating diffusion region, wherein a gate of the transfer transistor extends from over the semiconductor substrate downward to the carrier-accumulation region in the semiconductor substrate, and wherein the gate extends away from the floating diffusion region and overlaps more than half a width of the carrier-accumulation region.

Optionally, the gate may overlap 50% to 80% of the width of the carrier-accumulation region.

Optionally, the gate may overlap 80% to 100% of the width of the carrier-accumulation region.

Optionally, the gate of the transfer transistor may comprise a vertical transfer gate arranged in the semiconductor substrate and a gate protrusion that protrudes from the surface of the semiconductor substrate and is integral with the vertical transfer gate, wherein the vertical transfer gate extends away from the floating diffusion region and overlaps more than half the width of the carrier-accumulation region.

Optionally, the carrier-accumulation region may be an $N^-$ region formed in a P-well in the semiconductor substrate, wherein the pixel further comprises a $P^+$ region overlying the carrier-accumulation region and extending upward to the surface of the semiconductor substrate.

Optionally, the floating diffusion region may comprise an $N^+$ region formed in the semiconductor substrate and extending upward to the surface of the semiconductor substrate.

Optionally, the pixel may further comprise a $P^-$ interfacial improvement region formed in the semiconductor substrate around the vertical transfer gate.

Optionally, in the image sensor, the pixel may further comprise:

a reset transistor configured to reset the floating diffusion region to a reference voltage;

a source follower transistor, configured to be turned on or off under a control of a potential of the floating diffusion region; and a row select transistor configured to read out a signal in the pixel onto a column bit line.

Optionally, the image sensor may be a CMOS image sensor.

In another aspect of the present invention, there is provided an electronic device comprising a plurality of pixels, wherein at least one of the plurality of pixels comprises:

a photodiode formed in a semiconductor substrate, the photodiode having a carrier-accumulation region;

a floating diffusion region arranged in the semiconductor substrate side by side with respect to the photodiode, the floating diffusion region extending upward to a surface of the semiconductor substrate; and a transfer transistor located between the photodiode and the floating diffusion region, the transfer transistor configured to transfer carriers in the carrier-accumulation region to the floating diffusion region, wherein a gate of the transfer transistor extends from over the semiconductor substrate downward to the carrier-accumulation region in the semiconductor substrate, and wherein the gate extends away from the floating diffusion region and overlaps more than half a width of the carrier-accumulation region.

Optionally, the gate may overlap 50% to 80% of the width of the carrier-accumulation region.

Optionally, the gate may overlap 80% to 100% of the width of the carrier-accumulation region.

Optionally, the gate of the transfer transistor may comprise a vertical transfer gate arranged in the semiconductor substrate and a gate protrusion that protrudes from the surface of the semiconductor substrate and is integral with the vertical transfer gate, wherein the vertical transfer gate extends away from the floating diffusion region and overlaps more than half the width of the carrier-accumulation region.

Optionally, the carrier-accumulation region may be an $N^-$ region formed in a P-well in the semiconductor substrate, wherein the pixel further comprises a $P^+$ region overlying the carrier-accumulation region and extending upward to the surface of the semiconductor substrate.

Optionally, the floating diffusion region may comprise an $N^+$ region formed in the semiconductor substrate and extending upward to the surface of the semiconductor substrate.

Optionally, the pixel may further comprise a $P^-$ interfacial improvement region formed in the semiconductor substrate around the vertical transfer gate.

Optionally, in the electronic device, the pixel may further comprise:

a reset transistor configured to reset the floating diffusion region to a reference voltage;

a source follower transistor, configured to be turned on or off under a control of a potential of the floating diffusion region; and a row select transistor configured to read out a signal in the pixel onto a column bit line.

Optionally, the image sensor may be a CMOS image sensor.

In the image sensor provided in the present invention, at least one pixel includes a photodiode, a floating diffusion region and a transfer transistor located between the photodiode and the floating diffusion region. The photodiode includes a carrier-accumulation region, and a gate of the transfer transistor extends upward to the carrier-accumulation region. In addition, the gate extends away from the floating diffusion region and overlaps more than half of a width of the carrier-accumulation region. Given the fact that carriers move at a higher speed in a fast transfer channel present in the semiconductor substrate around such a gate, increasing the length of the transfer transistor's gate extending away from the floating diffusion region and overlapping the carrier-accumulation region can facilitate fast movement of carriers from the carrier-accumulation region through such fast transfer channels to the floating diffusion region, thus resulting in improved overall carrier transfer efficiency and optimized performance of the image sensor.

Since the electronic device provided in the present invention comprises the image sensor provided in the present invention, it can offer the same advantages as the image sensor.

In these figures: 100 and 200, a semiconductor substrate; 110 and 210, a photodiode; 111 and 211, a carrier-accumulation region; 220, a pixel isolation region; 120, a gate; 121 and 221, a gate oxide layer; 222, an interfacial improvement region; 230, a column bit line; and 201, a fast transfer channel.

DETAILED DESCRIPTION

The image sensor and electronic device proposed in the present invention will be described in greater detail by way of specific embodiments with reference to the accompanying drawings. Features and advantages of the invention will be more apparent from the following detailed description. Note that the figures are provided in a very simplified form not necessarily presented to scale, with their only intention to facilitate convenience and clarity in explaining the disclosed embodiments.

Figure 1A:
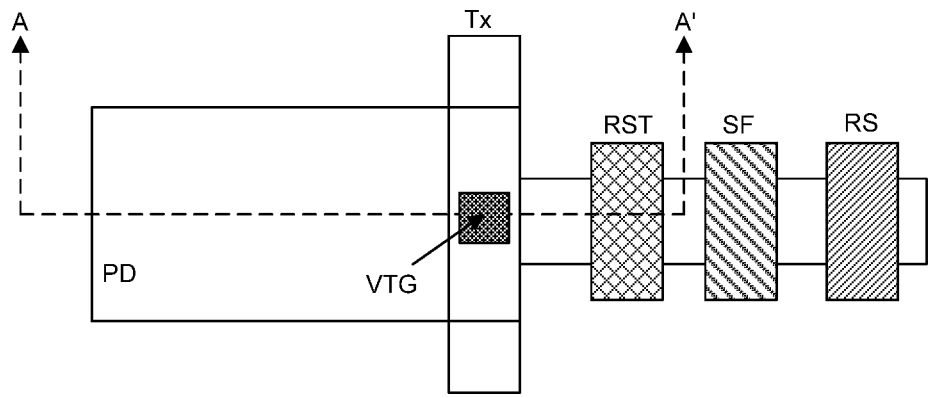
FIG. 1A is a schematic plan view of a pixel in an image sensor.
Figure 1B:
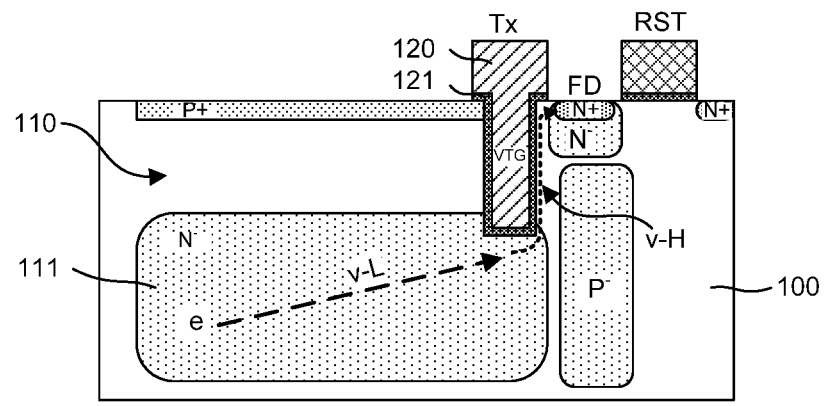
FIG. 1B is a schematic cross-sectional view taken along line AA' in FIG. 1A.

A clearer understanding of advantages of the image sensor provided in the present invention may be acquired by referring to the following description of an image sensor structure taken in conjunction with the accompanying figures. FIG. 1A is a schematic plan view of a pixel in an image sensor, and FIG. 1B is a schematic cross-sectional view taken along line AA' in FIG. 1A. Referring to FIGS. 1A and 1B, the pixel includes a photodiode 110 configured to convert incident light into carriers (i.e., signal charges), which are concentrated in a carrier-accumulation region 111. On the right of the carrier-accumulation region 111, there is a floating diffusion region FD arranged in the surface of the semiconductor substrate 100. Carriers in the carrier-accumulation region 111 can be transferred into the floating diffusion region FD under the action of a control signal. This will cause a change in a potential of the floating diffusion region FD, thus turning on or off a source follower transistor SF that is connected to the floating diffusion region FD. The floating diffusion region FD is also under the control of a reset transistor RST and can be reset under the action of a timing signal so as to prepare for the next transfer of carriers. The pixel may also include a row select transistor RS for addressing the pixel and reading out a signal from the pixel onto a column bit line. In this pixel structure, the transfer transistor Tx is configured to transfer carriers from the carrier-accumulation region 111 into the floating diffusion region FD under the control of a transfer gate. A gate oxide layer 121 is disposed between a gate 120 of the transfer transistor Tx and the semiconductor substrate 100. The gate 120 has a portion extending within the semiconductor substrate 100, thus forming a vertical transfer gate (VTG).

The pixel structure shown in FIGS. 1A and 1B is associated with deficiencies. Specifically, in this pixel structure, the transfer transistor Tx is rather narrow and distant from a left end of the carrier-accumulation region 111. For a small sized photodiode, this design will not have a significant impact on the pixel's performance because of a short distance and time for carriers to transfer from the carrier-accumulation region 111 into the floating diffusion region FD. However, for the photodiode 110 as shown in FIG. 1A with a relatively large lateral width of the carrier-accumulation region 111 in the semiconductor substrate 100, carriers around the left end of the region must travel a long distance to reach the floating diffusion region FD. In addition, as shown in FIG. 1B, such carriers (indicated at e) moves first laterally and slowly along the semiconductor substrate 100 under the action of an electrical potential difference to the vicinity of the vertical transfer gate VTG (as indicated by the dashed line in FIG. 1B, at a speed indicated at v-L) and then moves quickly through a fast transfer channel (as indicated by the dotted line in FIG. 1B, at a speed indicated at v-H) around the vertical transfer gate VTG to the floating diffusion region FD. In this process, the time taken before reaching the vicinity of the vertical transfer gate VTG accounts for a great proportion of the aggregate transfer time and overall affect the carriers' transfer efficiency. For this reason, during a signal read-out operation of the pixel, a sufficiently long time must be reserved to ensure a complete transfer of carriers accumulated in each integration period. This limits flexibility in circuit design, adversely affects image quality, and is detrimental to image sensor optimization. It is an object of the present invention to solve this problem.

Figure 2A:
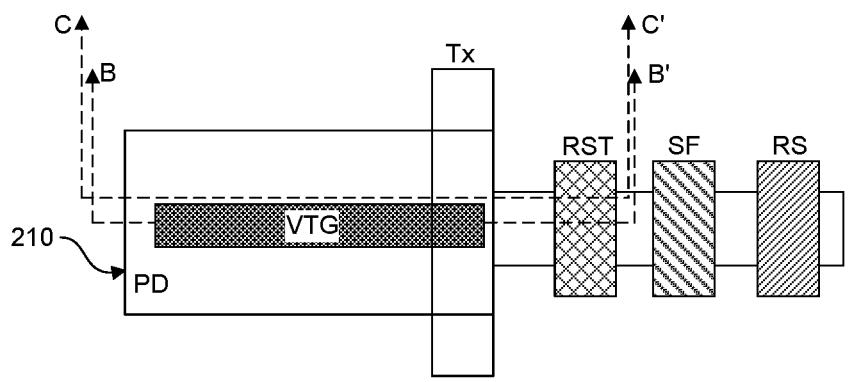
FIG. 2A is a schematic plan view of a pixel in an image sensor according to an embodiment of the present invention.
Figure 2B:
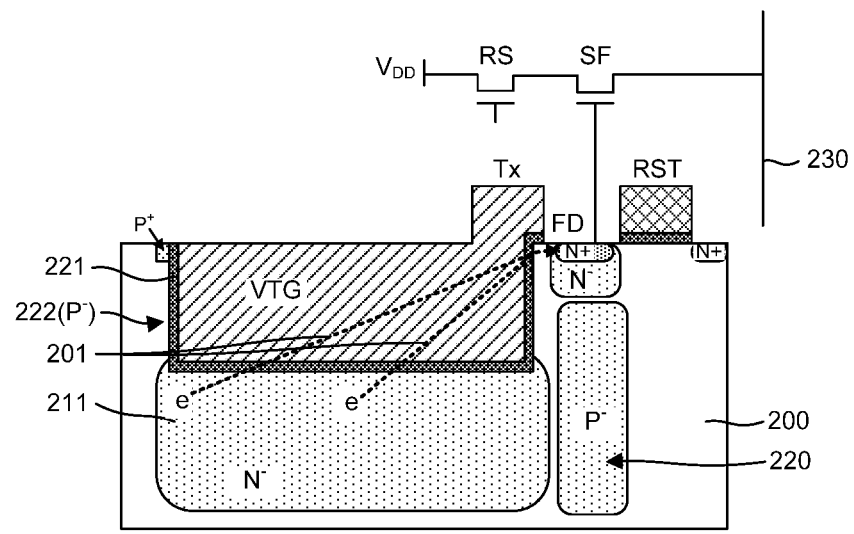
FIG. 2B is a schematic cross-sectional view taken along line BB' in FIG. 2A.
Figure 2C:
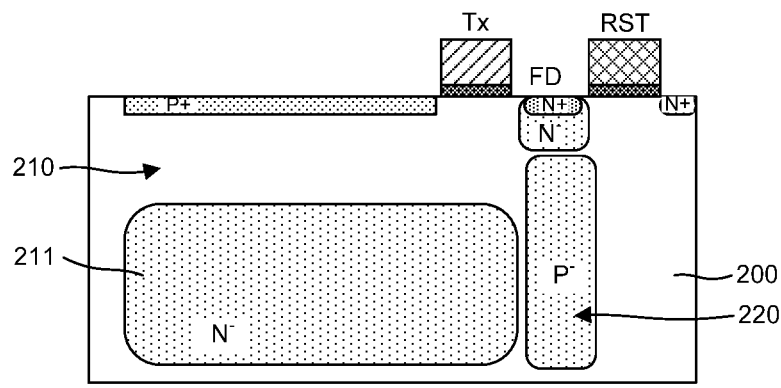
FIG. 2C is a schematic cross-sectional view taken along line CC' in FIG. 2A.

FIG. 2A is a schematic plan view of a pixel in an image sensor according to an embodiment of the present invention, and FIGS. 2B and 2C are schematic cross-sectional views taken along lines BB' and CC' in FIG. 2A, respectively. The image sensor will be described below with reference to FIGS. 2A to 2C.

Specifically, in this embodiment, the image sensor is formed on a semiconductor substrate 200. The semiconductor substrate may be made of any suitable material well known in the art, such as at least one of silicon (Si), germanium (Ge), silicon germanium (SiGe), silicon carbide (SiC), silicon germanium carbide (SiGeC), indium arsenide (InAs), gallium arsenide (GaAs), indium phosphide (InP) or other III/V compound semiconductors. Examples of the substrate may also include multilayer structures composed of the above semiconductors and silicon on insulator (SOI), strained silicon on insulator (SSOI), strained silicon germanium on insulator (S—SiGeOI), silicon germanium on insulator (SiGeOI), germanium on insulator (GeOI), double side polished (DSP), ceramic such as alumina, quartz, glass and other substrates. In this embodiment, the semiconductor substrate 200 is, for example, a silicon substrate. The image sensor may include a pixel region and a peripheral circuitry region (not shown), corresponding to different surface portions of the semiconductor substrate 200. The pixel region may include a plurality of pixels arranged into an array, while the peripheral circuitry region may be further demarcated into sub-regions in which horizontal drive circuitry, vertical drive circuitry, column signal processing circuitry (including a plurality of column bit lines arranged in parallel to one another), control circuitry and the like are arranged.

The image sensor according to this embodiment is, for example, a CMOS image sensor in which each of the pixels is configured to convert incident light into electrical signal outputs. To this end, each pixel may include a photodiode 210 capable of photoelectric conversion and a plurality of pixel transistors for control of carrier read-out. In another embodiment, the photodiode may be connected to a charge-coupled device (CCD) image sensor. This embodiment will be further described, with the pixels in the pixel region employing the design as shown in FIGS. 2A to 2C as an example, and only one of these pixels will be explained. It will be appreciated that it is also possible that some of the pixels in the pixel region adopt a design differing from the design of FIGS. 2A to 2C.

With reference to FIGS. 2A to 2C, in this embodiment, each pixel includes: the photodiode 210, formed in the semiconductor substrate 200; a floating diffusion region FD, formed in the semiconductor substrate 200 and extending upward to the surface thereof; and a transfer transistor Tx located between the photodiode 210 and the floating diffusion region FD. The photodiode 210 includes a carrier-accumulation region 211, and the floating diffusion region FD extends laterally with respect to the semiconductor substrate 200 and is arranged side by side with respect to the carrier-accumulation region 211. The transfer transistor Tx is configured to transfer carriers from the carrier-accumulation region 211 into the floating diffusion region FD. Additionally, a gate of the transfer transistor Tx extends longitudinally downward to the carrier-accumulation region 211, and the gate extends away from the floating diffusion region FD and overlaps more than half of a width of the carrier-accumulation region 211.

The photodiode 210 formed in the semiconductor substrate 200 may be a double-layer structure such as, for example, a photodiode formed by implanting N-type ions into a P-type semiconductor substrate or a photodiode formed by implanting P-type ions into an N-type semiconductor substrate. Alternatively, the photodiode may be a triple-layer structure such as, for example, a PIN photodiode of a pnp or npn structure. The photodiode may also be a multi-layer structure. In this embodiment, the photodiode 210 is, for example, a photodiode with N-type implantation ions, and the carrier-accumulation region 211 is an N$^-$ region formed in a P-well in the semiconductor substrate 200. Accordingly, the pixel further includes a P$^+$ region overlying the carrier-accumulation region 211 and extending upward to the surface of the semiconductor substrate 100. The P$^+$ region serves as a connecting layer of the photodiode 210. Further, around an outer edge of the photodiode 210, there is formed a pixel isolation region 220 in the semiconductor substrate 200, which is, for example, a P$^-$ or P$^+$ region. In another embodiment, the photodiode is, for example, a photodiode with P-type implantation ions, and the carrier-accumulation region is a P$^-$ region in an N-well in the semiconductor substrate. Accordingly, the pixel further includes an N$^+$ region overlying the carrier-accumulation region 211 and extending upward to the surface of the semiconductor substrate 100. Further, around an outer edge of the photodiode, there is formed a pixel isolation region 220, which is, for example, an N$^-$ or N$^+$ region. In addition to providing the photodiode with a connection, the P$^+$ or N$^+$ region overlying the carrier-accumulation region 211 and extending to the surface of the semiconductor substrate 100 also contributes to reducing lattice defects, and hence dark currents, on the surface of the semiconductor substrate. As used here and hereinafter, "N$^-$" refers to a relatively low n-doping concentration; "N$^+$" refers to a relatively high n-doping concentration; "P$^-$" refers to a relatively low p-doping concentration; and "P$^+$" refers to a relatively high p-doping concentration. The term "relatively high concentration" is used with respect to "relatively low concentration". For example, a "relatively high concentration" may be approximately 10 times a "relatively low concentration". For a silicon substrate, an n-dopant may be, for example, arsenic or phosphorus, while a p-dopant may be, for example, boron or indium.

The transfer transistor Tx is configured to transfer carriers from the carrier-accumulation region 211 into the floating diffusion region FD. Specifically, in an integration period, the photodiode 210 produces carriers (i.e., signal charges) in response to the incident light, which are then accumulated in the carrier-accumulation region 211. At the end of the integration period, by applying a high voltage pulse to the transfer gate, the transfer transistor Tx is made conductive, allowing charges in the carrier-accumulation region 211 (indicated at e in FIG. 2B) to follow toward the floating diffusion region FD. After all the accumulated carriers have been transferred to the floating diffusion region FD, the transfer transistor Tx is cut off and maintain in this state until it is again switched on in the next integration period. Preferably, the transfer transistor Tx is a vertical transfer transistor with a vertical transfer gate VTG, which allows a greater fill factor with the same size of the photodiode 210 in the pixel and an increased amount of charges per unit volume. The vertical transfer gate VTG is arranged in a trench formed in the semiconductor substrate 200. In this embodiment, the trench extends downward to a top of the carrier-accumulation region 211, and the connecting layer of the photodiode is formed in a surface portion of the semiconductor substrate surrounding the trench. The transfer transistor Tx further includes a gate portion integral with the vertical transfer gate VTG and protruding from the surface of the semiconductor substrate 200 (referred to hereinafter as the "gate protrusion") so as to be able to be connected to an external signal. The gate is made of, for example, polysilicon. Further, in order to isolate the polysilicon from the semiconductor substrate 200, a gate oxide layer 221 is formed over an interior surface of the trench in the semiconductor substrate 200, in which vertical transfer gate VTG is formed. In this embodiment, in order to modify interfacial conditions of the vertical transfer gate VTG and suppress dark currents that may be caused by lattice defects and distortions on the trench's interior surface, an interfacial improvement region 222 is formed in the semiconductor substrate 200 to surround the vertical transfer gate VTG. The interfacial improvement region 222 may be formed as P$^-$ interfacial improvement region by implanting dopant ions that can combine with defect-forming charges and thus mitigate, or even eliminate, the generation of dark currents at the interface between the gate oxide layer 221 and the semiconductor substrate 200.

The floating diffusion region FD is formed on the side of the transfer transistor Tx away from the photodiode 210. Specifically, in this embodiment, the floating diffusion region FD includes an N+ region formed in the semiconductor substrate 200 and extending upward to the surface thereof. This N+ region is located close to the gate protrusion of the transfer transistor Tx that protrudes out of the surface of the semiconductor substrate 200. In this embodiment, the floating diffusion region FD is located above the pixel isolation region 220 and is vertically aligned therewith. Specifically, the N+ region of the floating diffusion region is formed in an N-well (an N$^-$ surface region) above the P– pixel isolation region 220.

With reference to FIGS. 2A and 2B, the image sensor according to this embodiment may further include a reset transistor RST, a source follower transistor SF and a row select transistor RS, each of which is arranged on the semiconductor substrate 200. Specifically, a potential of the floating diffusion region FD will change when carriers flow therein, thus turning on or off the source follower transistor SF connected thereto by electrical potential signal. The source follower transistor SF is an amplification transistor, whilst the row select transistor RS is connected in series with the source follower transistor between a power supply voltage VDD and a column bit line 230. The row select transistor RS is configured to address the pixel and selectively read out a signal of the pixel present on the column bit line 230. After read-out of the signal from the column bit line 230, the reset transistor RST resets the floating diffusion region FD to a reference voltage (e.g., VDD) so as to wait for the next transfer of carriers.

As discussed above, for a carrier needing to diffuse laterally with respect to the surface of the semiconductor substrate 100, if it is relatively distant from the vertical transfer gate VTG of the transfer transistor Tx, it will move slowly (v-L) before reaching the fast transfer channel (v-H), limiting the overall carrier transfer efficiency of the pixel. In this embodiment, with reference to FIGS. 2A to 2C, the gate of the transfer transistor Tx extends away from the floating diffusion region FD and overlaps more than half of a width of the carrier-accumulation region 211 in the photodiode 210. With this design, channels in which carriers can be transferred around the gate of the transfer transistor into the floating diffusion region is like the fast transfer channel 201 as shown in FIG. 2B. Specifically, at the end of an integration period in which carriers are produced in response to light incident on the photodiode 210, a high voltage pulse may be applied to the transfer gate of the transfer transistor Tx and thus turn on the transistor. At this time, carriers in the vicinity of the vertical transfer gate VTG will move quickly into fast transfer channels 201 present around an outer periphery of the vertical transfer gate VTG where the carriers are transferred at a high speed (v-H) into the floating diffusion region FD. Compared to the pixel structure of FIGS. 1A and 1B, this design can greatly reduce the time required by carriers in various portions of the carrier-accumulation region 211 to reach the floating diffusion region FD, resulting in enhanced carrier transfer efficiency. Moreover, this design also allows easier control of carrier transfer and more flexibility in circuit design, contributing to improved pixel quality of the image sensor.

As an example, the gate of the transfer transistor Tx may extend away from the floating diffusion region FD and overlap 50% to 80% of the width of the carrier-accumulation region 211 in the photodiode 210. As another example, the gate of the transfer transistor Tx may extend away from the floating diffusion region FD and overlap 80% to 100% of the width of the carrier-accumulation region 211 in the photodiode 210. Alternatively, the gate of the transfer transistor Tx may extend throughout the entire width of the carrier-accumulation region 211 in the photodiode 210.

With reference to FIGS. 2A to 2C, during fabrication of such a pixel, forming the transfer transistor Tx between the carrier-accumulation region 211 and the floating diffusion region FD may include the steps as detailed below.

At first, forming the trench for the vertical transfer gate VTG in the semiconductor substrate 200. The formed trench extends longitudinally with respect to the semiconductor substrate 200 upward to the carrier-accumulation region 211 in the photodiode. Moreover, in order to achieve a desired fast transfer effect of the vertical transfer gate VTG, the trench extends away from the floating diffusion region FD and overlaps more than half of the width of the carrier-accumulation region 211.

Subsequently, in order to suppress dark currents that may be caused by lattice defects and distortions on the interior surface of the trench, dopant ions may be implanted into the interior surface so as to form the interfacial improvement region 222 in the semiconductor substrate 200 along the interior surface.

Next, forming the gate oxide layer 221 over the trench's interior surface so as to isolate the semiconductor substrate 200 from the material of the gate to be subsequently filled in the trench.

After that, forming the gate of the transfer transistor Tx in the trench. In this embodiment, the formation may include: filling the material of the gate, such as polysilicon, into the trench until the trench is filled up and the material is located above the surface of the semiconductor substrate 200; and patterning the polysilicon located above the surface of the semiconductor substrate to remove desired portions thereof. In this embodiment, for cost considerations, a photolithography process using a photomask corresponding to the gate of FIG. 1B may be used to pattern the polysilicon above the surface of the semiconductor substrate. Further, a gate of the reset transistor may be fabricated simultaneously with the gate of the transfer transistor Tx.

The so-fabricated gate of the transfer transistor Tx includes a portion situated within the trench, which forms the vertical transfer gate VTG, and a portion protruding from the semiconductor substrate surface. The vertical transfer gate VTG extends away from the floating diffusion region FD and overlaps more than half of the width of the carrier-accumulation region 211. With reference to FIGS. 2A and 2C, in order to minimally affect a fill factor of the pixel, in a plan view of the semiconductor substrate 200, the vertical transfer gate VTG extends away from the floating diffusion region FD as in a elongated shape with a width measured in the direction perpendicular to its direction of extension that is shorter than a length measured in its direction of extension. That is, the vertical transfer gate and the transfer transistor gate protruding out of the surface of the semiconductor substrate (i.e., the gate protrusion) together define a T-shaped cross-section along a direction parallel with the surface of the semiconductor substrate, which can minimize shading of incident light. Since the vertical transfer gate VTG has a relatively large overlap with the carrier-accumulation region 211 along its lengthwise direction, long fast transfer channels are formed around it in the semiconductor substrate, in which carriers travel laterally at a significantly increased speed. As a result, the carriers can be more rapidly transferred to the floating diffusion region FD, leading to enhanced transfer efficiency. The shape of the trench and hence of the vertical transfer gate VTG, as well as the size of their overlap with the carrier-accumulation region, can be adjusted and determined as needed.

In this embodiment, there is also provided an electronic device incorporating the image sensor as defined above. The image sensor may be arranged in a still camera module (or video recorder module) in the electronic device. The electronic device may be any of various devices equipped with such a camera module, such as a digital camera, a mobile phone, a security camera, a game console, etc. Specifically, in addition to the image sensor, the camera module may further include an optical lens and associated driving circuitry. The optical lens is configured to guide incident light into pixels of the image sensor, and carriers are responsively accumulated in integration periods in the photodiodes and read out. The driving circuitry is configured to provide the image sensor with drive signals (including timing signals) for causing the carriers accumulated in the photodiodes to be transferred to the floating diffusion regions FD in certain time intervals and read out from the column bit lines. In this embodiment, in some or all of the pixels in the image sensor, each transfer transistor has a relatively long vertical transfer gate VTG that extends away from the floating diffusion region FD and overlaps more than half of the width of the carrier-accumulation region in the photodiode. With this design, even when the carrier-accumulation region has a large size and is located distant from the floating diffusion region FD, carriers in various portions of the carrier-accumulation region can be transferred at a high speed in fast transfer channels in the semiconductor substrate beside the vertical transfer gate VTG. As a result, carriers in the pixels can be transferred with higher efficiency, which is conducive to performance optimization of the image sensor and can thus result in enhanced imaging quality of an electronic device employing the image sensor.

While the invention has been described with reference to several preferred embodiments, it is not intended to be limited to these embodiments in any way. Any person of skill in the art may make various possible variations and changes to the disclosed embodiments without departing from the spirit and scope of the invention. Accordingly, any and all such simple variations, equivalents and modifications made to the foregoing embodiments without departing from the scope of the invention are intended to fall within the scope thereof.

What is claimed is:

1. An image sensor, comprising a plurality of pixels, wherein at least one of the plurality of pixels comprises:
   a photodiode formed in a semiconductor substrate, the photodiode having a carrier-accumulation region;
   a floating diffusion region arranged in the semiconductor substrate side by side with respect to the photodiode, the floating diffusion region extending upward to a surface of the semiconductor substrate; and
   a transfer transistor located between the photodiode and the floating diffusion region, the transfer transistor configured to transfer carriers in the carrier-accumulation region to the floating diffusion region,
   wherein a gate of the transfer transistor extends from over the semiconductor substrate downward to the carrier-accumulation region in the semiconductor substrate, and wherein the gate extends away from the floating diffusion region and overlaps more than half a width of the carrier-accumulation region.

2. The image sensor of claim 1, wherein the gate overlaps 50% to 80% of the width of the carrier-accumulation region.

3. The image sensor of claim 1, wherein the gate overlaps 80% to 100% of the width of the carrier-accumulation region.

4. The image sensor of claim 1, wherein the gate of the transfer transistor comprises a vertical transfer gate arranged in the semiconductor substrate and a gate protrusion that protrudes from the surface of the semiconductor substrate and is integral with the vertical transfer gate, and wherein the vertical transfer gate extends away from the floating diffusion region and overlaps more than half the width of the carrier-accumulation region.

5. The image sensor of claim 4, wherein the carrier-accumulation region is an $N^-$ region formed in a P-well in the semiconductor substrate, wherein the pixel further comprises a $P^+$ region overlying the carrier-accumulation region and extending upward to the surface of the semiconductor substrate.

6. The image sensor of claim 4, wherein the floating diffusion region comprises an $N^+$ region formed in the semiconductor substrate and extending upward to the surface of the semiconductor substrate.

7. The image sensor of claim 5, wherein the pixel further comprises a $P^-$ interfacial improvement region formed in the semiconductor substrate around the vertical transfer gate.

8. The image sensor of claim 1, wherein the pixel further comprises:
   a reset transistor configured to reset the floating diffusion region to a reference voltage;
   a source follower transistor, configured to be turned on or off under a control of a potential of the floating diffusion region; and
   a row select transistor configured to read out a signal in the pixel onto a column bit line.

9. The image sensor of claim 1, wherein the image sensor is a CMOS image sensor.

10. An electronic device, comprising an image sensor comprising a plurality of pixels, wherein at least one of the plurality of pixels comprises:
    a photodiode formed in a semiconductor substrate, the photodiode having a carrier-accumulation region;

a floating diffusion region arranged in the semiconductor substrate side by side with respect to the photodiode, the floating diffusion region extending upward to a surface of the semiconductor substrate; and a transfer transistor located between the photodiode and the floating diffusion region, the transfer transistor configured to transfer carriers in the carrier-accumulation region to the floating diffusion region, wherein a gate of the transfer transistor extends from over the semiconductor substrate downward to the carrier-accumulation region in the semiconductor substrate, and wherein the gate extends away from the floating diffusion region and overlaps more than half a width of the carrier-accumulation region.

11. The electronic device of claim 10, wherein the gate overlaps 50% to 80% of the width of the carrier-accumulation region.

12. The electronic device of claim 10, wherein the gate overlaps 80% to 100% of the width of the carrier-accumulation region.

13. The electronic device of claim 10, wherein the gate of the transfer transistor comprises a vertical transfer gate arranged in the semiconductor substrate and a gate protrusion that protrudes from the surface of the semiconductor substrate and is integral with the vertical transfer gate, and wherein the vertical transfer gate extends away from the floating diffusion region and overlaps more than half the width of the carrier-accumulation region.

14. The electronic device of claim 13, wherein the carrier-accumulation region is an $N^-$ region formed in a P-well in the semiconductor substrate, wherein the pixel further comprises a $P^+$ region overlying the carrier-accumulation region and extending upward to the surface of the semiconductor substrate.

15. The electronic device of claim 13, wherein the floating diffusion region comprises an $N^+$ region formed in the semiconductor substrate and extending upward to the surface of the semiconductor substrate.

16. The electronic device of claim 14, wherein the pixel further comprises a $P^-$ interfacial improvement region formed in the semiconductor substrate around the vertical transfer gate.

17. The electronic device of claim 10, wherein the pixel further comprises:

a reset transistor configured to reset the floating diffusion region to a reference voltage;

a source follower transistor, configured to be turned on or off under a control of a potential of the floating diffusion region; and a row select transistor configured to read out a signal in the pixel onto a column bit line.

18. The electronic device of claim 10, wherein the image sensor is a CMOS image sensor.

* * * * *